United States Patent [19]

VanVonno

[11] Patent Number: 4,510,518
[45] Date of Patent: Apr. 9, 1985

[54] DIELECTRIC ISOLATION FABRICATION FOR LASER TRIMMING

[75] Inventor: N. W. VanVonno, Melbourne, Fla.

[73] Assignee: Harris Corporation, Melbourne, Fla.

[21] Appl. No.: 608,507

[22] Filed: May 9, 1984

Related U.S. Application Data

[62] Division of Ser. No. 518,725, Jul. 29, 1983, Pat. No. 4,468,414.

[51] Int. Cl.³ .................. H01L 27/12; H01L 27/02; H01L 10/00; B23K 9/00
[52] U.S. Cl. .................. 357/49; 357/51; 357/55; 357/59; 338/195; 219/121 LJ
[58] Field of Search .................. 357/49, 47, 51, 55, 357/59; 338/195; 219/121 LJ

[56] References Cited

U.S. PATENT DOCUMENTS

| | | | |
|---|---|---|---|
| 3,858,237 | 12/1974 | Sawazaki et al. | 357/49 |
| 3,886,587 | 5/1975 | Nicolay | 357/49 |
| 3,956,034 | 5/1976 | Nicolay | 357/49 |
| 4,146,673 | 3/1979 | Headley | 427/101 |
| 4,179,310 | 12/1979 | Compton et al. | 357/49 |
| 4,210,925 | 7/1980 | Morcom et al. | 357/49 |
| 4,255,209 | 3/1981 | Morcom et al. | 357/49 |
| 4,272,775 | 6/1981 | Compton et al. | 357/49 |
| 4,409,609 | 10/1983 | Fukuda | 357/49 |

Primary Examiner—William D. Larkins
Assistant Examiner—Mark Prenty
Attorney, Agent, or Firm—Barnes & Thornburg

[57] ABSTRACT

Single crystalline dielectrically isolated islands are formed providing an opening in the bottom dielectric isolation of selected islands before the application of the polycrystalline support. Thin film resistor material is formed and delineated on an insulative layer over the signal crystalline island juxtaposed with the opening of the bottom dielectric isolation. The thin film resistive layer is trimmed using a laser.

1 Claim, 12 Drawing Figures

DIELECTRIC ISOLATION FABRICATION FOR LASER TRIMMING

This is a divisional of application Ser. No. 518,725 filed July 29, 1983, now U.S. Pat. No. 4,468,414.

BACKGROUND OF THE INVENTION

The present invention relates generally to laser trimming and more specifically to laser trimming above a dielectrically isolated single crystalline region.

Laser trimming of thin-film resistors is used extensively to produce improved accuracy in analog integrated circuit technology. In integrating laser trimming into dielectrically isolated circuit technology a difficulty peculiar to dielectric isolation has been identified. Trimming is generally accomplished by use of an infrared laser for improved control. Silicon is nearly transparent at the wavelengths used; this results in laser energy penetrating to the bottom of the dielectrically isolated island, reflecting back and transferring some of the reflected energy back to the resistor. The result is poor control due to interference effects. These effects are variable due to changes in dielectrically isolated island depth and proper control over trim energy hence becomes very difficult.

An existing technique addresses the problem by simply placing the thin-film resistor over the polycrystalline silicon used to support the dielectrically isolated regions. The polysilicon is much thicker than the single-crystal islands (typically 10 mils vs. 1 mil) and energy scattering off the grain boundaries soon dissipates the laser beam. The resulting lack of reflection and interference produces enhanced controllability. The resistor is deposited over a polycrystalline surface which is not perfectly flat but in fact possesses considerable relief at the grain boundaries. In addition, large polycrystalline areas tend to "dish out" which complicates laser focussing and reduces photoresist definition, resulting in poor control over resistor geometries. There is also concern over the validity of thin film over polycrystalline systems for high-reliability applications.

SUMMARY OF THE INVENTION

An object of the present invention is to provide a method of fabricating laser trimmed thin film resistors over single crystal islands.

Another object of the present invention is to provide a method of laser trimming thin film resistors on dielectrically isolated integrated circuits.

These and other objects of the invention are attained by fabricating dielectrically isolated single crystal islands over which are formed the thin film resistors with an opening in the bottom of the dielectric isolation. The thin film resistor is formed over an insulative surface on the single crystal region and is subsequently laser trimmed. The opening in the bottom of the dielectric isolation of the single crystal islands including a polycrystalline support structure may be formed by putting a oxide inhibiting mask over the starting substrate followed by formation of an oxide mask to define the isolation moats, formation of moats using the oxide mask, forming the dielectric isolation layer over the bottom of the substrate and the face of the moats, stripping of the oxide inhibiting mask, applying the polycrystalline support structure and removing the top surface of the original substrate to form the dielectrically isolated regions. Alternatively, the opening in the bottom surface of the dielectric isolation layer may be formed by completely oxidizing the bottom of the substrate and the faces of the moat followed by a mask and removal step of the dielectric isolation at the bottom of selected regions. A third alternative is to form the moat mask and the moats followed by applying an oxide inhibiting layer over a region of the bottom surface of the substrate followed by oxidization to form the dielectric isolation except in the regions covered by the oxide inhibiting mask. This is followed by applying the polycrystalline support structure. After forming the dielectrically isolated islands, the top surface of the substrate is covered with an insulative layer and the thin film resistive material is applied and delineated thereon to form a resistor juxtaposed to the opening in the bottom dielectric isolation. This is followed by laser trimming using a laser of suitable wavelength and power level.

Other objects, advantages and novel features of the present invention will become evident from the following detailed description of the invention when considered in conjunction with the accompanying drawings.

DETAILED DESCRIPTION OF THE PREFERRED EMBODIMENTS

Figure 1:
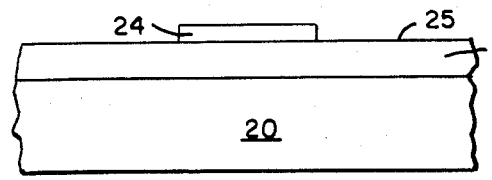
FIGS. 1 through 7 are cross-sectional views illustrating the different stages of fabricating a laser trimmed thin film resistor on dielectrically isolated single crystal islands according to the principles of the present invention.
Figure 2:
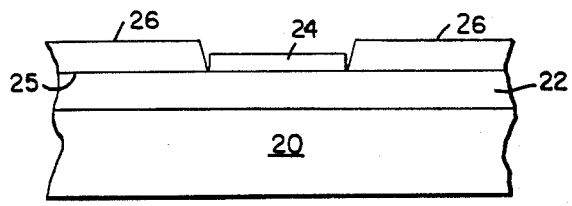

The method of fabricating laser trimmed thin film resistors on dielectrically isolated single crystal islands begins as illustrated in FIG. 1 by epitaxially growing a single crystal layer 22 on a single crystal substrate 20. Substrate 20 has a substantially higher impurity concentration and lower resistance than the epitaxial layer 22. An oxide inhibiting mask layer 24 for example, silicon nitride, is applied to the exposed surface 25 of the epitaxial layer 22 and patterned to cover a region of the single crystal epitaxial layer 22. The exposed surface 25 of the epitaxially layer 22 is then subjected to an oxidizing atmosphere which forms an oxide masking layer 26 across surface 25 except that region covered by the oxide inhibiting layer 24. The structure at this stage is illustrated in FIG. 2.

Figure 3:
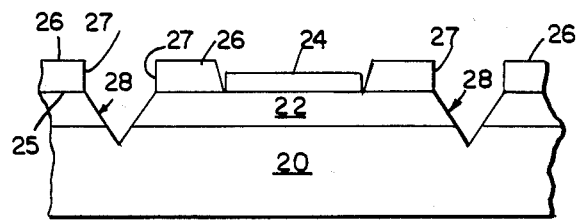
Figure 4:
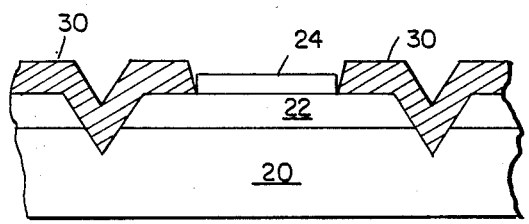

The mask layer 26 is delineated by standard photolithographic processes to form openings 27 therein. The epitaxial layer 22 and the substrate 20 are then etched to form the V-shaped moats 28 as illustrated in FIG. 3. The oxide mask layer 26 is then removed and the exposed surface of the moats as well as the epitaxial layer 22 are exposed to an oxidizing atmosphere such that the dielectric isolation region 30 is formed thereon except on the regions covered by the oxide inhibiting mask 24. The resulting structure is illustrated in FIG. 4.

Figure 5:
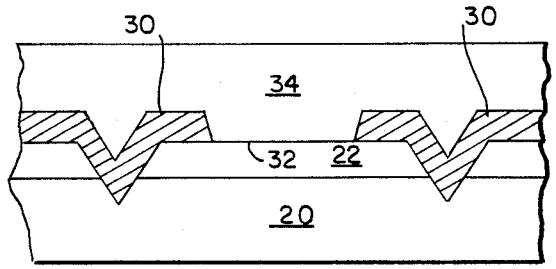
Figure 11:
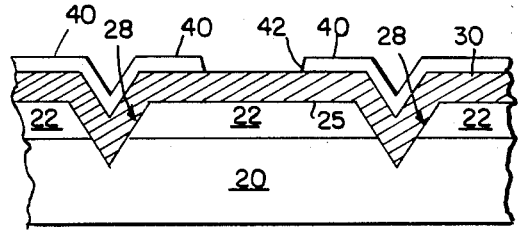
Figure 6:
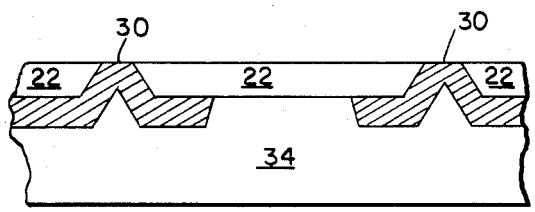

The oxide inhibiting layer 24 is then removed and a polycrystalline material is deposited over the dielectric isolation layer 30 and into the opening 32 left by the removal of the oxide inhibiting mask 24. The polycrystalline support structure 34 is illustrated in FIG. 5. The substrate 20 is removed by well-known methods which may include grinding or wet etching in combination with grinding down to the bottom of the moat regions 28 to expose the tip of the dielectric isolation layer 30 to define a plurality of dielectrically isolated single crystalline regions of the original epitaxial layer 22 as illustrated in FIG. 6.

An insulation layer 36 for example, silicon dioxide, is formed on the top surface 37 of the single crystal regions. A thin film resistor material 38 is then applied on the insulative layer 36 and delineated to form substantially the geometry of the thin film resistors juxtaposed to the opening 32 in the dielectric isolation at the bottom of the single crystalline region 22. The final geometry and characteristic of the thin film resistor is defined by laser trimming the layer 38. Preferably, the laser is an infrared laser. Since the silicon is nearly transparent at infrared wavelengths, the laser energy penetrates through the single crystalline region 22 and into the polycrystalline support region 34 through the opening 32 on the dielectric isolation 30. Little if any of the laser radiation is reflected back affecting the thin film resistor 38. Since the thin film resistor 38 is formed over the single crystal region 22, the energy scattering off the grain boundaries dissipates the laser beam thereby minimizing reflection and interference. Similarly, the well-defined and flat surface of the single crystalline region do not result in dishing out or other problems with large polycrystalline silicon areas.

Figure 7:
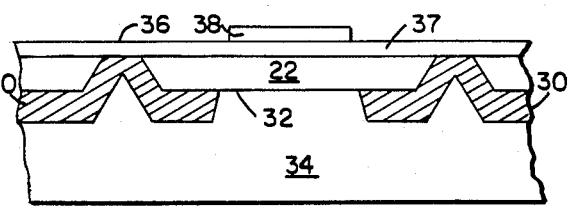
Figure 8:
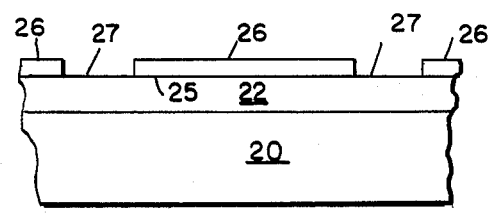
FIGS. 8 through 11 are cross-sectional views illustrating a modification of the process of FIGS. 1 through 7.
Figure 9:
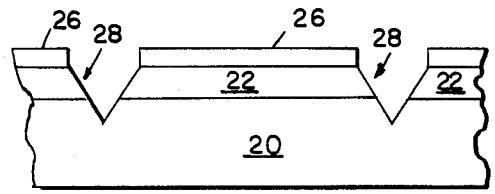
Figure 10:
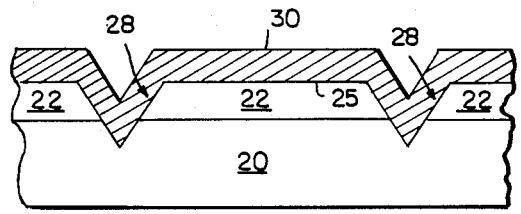

An alternative method for forming the opening in the dielectric isolation 30 at the bottom of the single crystal region 22 is illustrated in FIGS. 8 through 11. The oxide moat mask 26 is formed on the entire surface 25 of the epitaxial region 22 and moat openings 27 are formed therein as illustrated in FIG. 8. The moat regions 28 are formed in the epitaxial layer 22 and the substrate 20 using the moat mask 26 as illustrated in FIG. 9. The mask 26 is removed and the wafer is then subjected to an oxidizing atmosphere to form the dielectric isolation region 30 over the walls of the moats 28 and the bottom surface 25 of the epitaxial region 22 as illustrated in FIG. 10. A mask layer 40 is then formed on the dielectric isolation 30 and an opening 42 is provided therein. The portion of the dielectric isolation 30 exposed by the opening 42 is then removed to form the dielectric isolation 30 with an opening therein exposing the bottom of the single crystal region 22. The process is then completed following the steps of FIGS. 5, 6 and 7.

Figure 12:
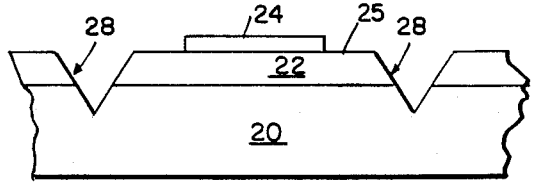
FIG. 12 is a cross-sectional view illustrating a further modification of the process of FIGS. 8 through 11.

A second alternative method of fabrication is to perform the moat masking and etching following the steps of FIGS. 8 and 9 including the stripping of the masking layer 26. Before the formation of the dielectric isolation region 30, an oxide inhibiting layer 24 is applied and delineated to cover a region of the bottom surface 25 of the epitaxial region 22. The resulting structure is illustrated in FIG. 12. This is followed by the oxidation to form the dielectric isolation region 30 following the process steps of FIGS. 4 through 7.

It should be noted that the method of fabrication of FIGS. 1 through 4 are preferred since no masking steps are performed after the formation of the moats 28. In the modification of the embodiments illustrated in FIGS. 11 and 12, a masking layer 40 in FIG. 11 and the oxide inhibiting layer 24 are formed not only on the bottom surface 25 of the epitaxial layer but is also formed in the moat regions 28. These mask regions must be removed and consequently the moat regions are subjected to possibly some additional etching which may be undesirable since it may effect the spacing and accuracy of the dielectric isolation.

From the preceding description of the preferred embodiments, it is evident that the objects of the invention are attained and although the invention has been described and illustrated in detail, it is to be clearly understood that the same is by way of illustration and example only and is not to be taken by way of limitation. The spirit and scope of this invention are to be limited only by the terms of the appended claims.

What is claimed is:

1. An integrated circuit with a thin film resistor comprising:
    a plurality of single crystal islands dielectrically isolated from a polycrystalline support, one or more of which include an opening in the bottom of said dielectric isolation to optically expose a portion of said polycrystalline support from the top surface of said single crystalline island;
    an isolation layer on said top surface of said single crystal island; and
    a thin film resistor on said surface isolation layer juxtaposed with said opening in said bottom of said dielectric isolation.

* * * * *